United States Patent [19]
Gordon

[11] Patent Number: 5,921,462
[45] Date of Patent: Jul. 13, 1999

[54] BALL GRID ARRAY BALL PLACEMENT METHOD AND APPARATUS

[76] Inventor: Thomas A. Gordon, 12044 Rue Des Amis, San Diego, Calif. 92131

[21] Appl. No.: 08/804,385

[22] Filed: Feb. 21, 1997

[51] Int. Cl.$^6$ .......................... B23K 31/02; B23K 37/06; B23K 3/08
[52] U.S. Cl. ....................... 228/191; 228/248.1; 228/254; 228/33; 228/49.5
[58] Field of Search ................ 228/254, 248.1, 228/49.5, 44.7, 33, 191

[56] References Cited

U.S. PATENT DOCUMENTS

| | | | |
|---|---|---|---|
| 5,782,399 | 7/1998 | Lapastora | 228/248.1 |
| 5,806,753 | 9/1998 | Bielick et al. | 228/191 |

*Primary Examiner*—Patrick Ryan
*Assistant Examiner*—Jeffrey T. Knapp

*Attorney, Agent, or Firm*—John R. Duncan; Frank D. Gilliam

[57] ABSTRACT

A method and apparatus enables the securing of balls to ball grid array electronic components. A component having a surface with rows and columns of electrical contact pads is removed from a printed circuit board for rework. Excess solder is removed from the pads and the surface is pressed against a stencil having a pattern of holes corresponding to the component contact pad pattern. The holes are filled with a paste continuing flux and solder particles. The assembly is heated to melt the solder particles, which agglomerate into generally spherical balls bonded to the contact pads. The assembly is cooled, the stencil is removed, the component is cleaned and is ready for reuse. Preferably, the stencil is formed from a material that bows in one direction when heated, so that when the stencil is held against the pad array surface and heated, bowing forces will very tightly press the stencil against the surface, preventing molten solder from migrating between surface and stencil.

20 Claims, 3 Drawing Sheets

5,921,462

BALL GRID ARRAY BALL PLACEMENT METHOD AND APPARATUS

BACKGROUND OF THE INVENTION

This invention relates in general to the placement of electronic components on printed circuit boards and, more specifically to a method and apparatus for very precisely forming very small solder balls on an array of contact pads on an integrated circuit component substrate.

Originally, printed circuit boards included plated holes into which leads of electronic components were inserted and soldered. Currently, circuit boards tend to have closely spaced surface pads with the component simply placed on the board with leads in contact with the pads, to which the leads are then soldered.

The pattern of closely spaced wires and contact pads for connection to component leads are usually formed on the printed circuit board base by silkscreening techniques. The pattern is typically in the form of a single square or rectangular row, conforming to the leads extending from the peripheral edge of an electronic component. After board fabrication and during assembly operations, a thin stencil having holes conforming to the pad pattern is placed over the pad array and precisely aligned therewith. A solder paste made up of very small solder balls in a slurry of flux and other ingredients is wiped over the stencil with a squeegee, forcing small amounts of paste through the holes onto the pads. The stencil is lifted away leaving a coating of the paste on the pads. The components must then be very precisely placed on the board with the component leads aligned with the pads. Accuracies on the order of 0.0005 inch are often required. Once the component is placed, the solder is melted, generally in an infrared or convection oven, and solder bonds are formed between the pad and lead.

Very large, very expensive, robotic machines have been developed for accurately placing components on such surface mount boards with leads precisely aligned and soldering the leads to the pads in very high volume manufacturing operations. These machines make use of extremely expensive vision alignment equipment and other optical devices to precisely locate the components. These large and complex machines require considerable operator training and the component and board designs cannot be rapidly and easily changed. Exemplary of such machines is that described by Takahashi et al. in U.S. Pat. No. 4,292,116. Such large devices are not economically feasible, or well adapted to, low to medium volume operations where only a few fine pitch parts are placed on relatively few boards or for rework of components removed from such boards.

Many integrated circuit components have a row of very closely spaced contacts around the component periphery. Today, components are being developed that have an array of copper pads across the underside of the components in rows and columns at various pitch locations. Bumps or balls of solder are provided on the copper pads to make interconnect points (a ball grid array) for attachment of the component to a corresponding pattern on a circuit board.

Typically, solder balls are attached to the component pads by screening a flux in paste or gel form onto the underside of the component. Then preformed balls are shaken into a stencil which is aligned with the component pads. The balls are held in place by the gel as the stencil is removed. The assembly is sent through an oven to melt the balls which attach to the copper pad on the substrate, completing the integrated circuit package. This is an effective, although very slow, process.

The component can be fastened to a printed circuit board by normal surface mount processes. A flux paste is applied to the corresponding array of copper pads on the board, the component is placed over the pads with the solder ball array aligned, and the assembly is heated. The solder ball combines with the paste and the sphere, although growing larger, will collapse onto the pads under the weight of the component, making the interconnect.

While good connections are made, in some cases differences in the coefficient of thermal expansion of component and board are enough different to cause high stress at the corners of the array so that connections may fail during thermal cycling in use.

Sometimes ball grid array components must be removed from a printed circuit board for rework of the overall board. Because of the density of the component connections, the components are usually quite expensive, so that the ability to repair and re-use them is important. Desoldering tools and heat profiles have been developed for removing components from a printed circuit board that will retain most, but generally not all, high temperature balls on the component pads. With low temperature balls that melted during mounting the entire component must be reballed. In some cases, solder bridges will form between pads so that solder will have to be completely wiped or wicked off of the pads.

Reballing is often done with small tools used in a manner that essentially mimics the original manufacturing method of balling parts. A first screen is positioned over the contact pad array, a flux past or solder paste is wiped over the screen to add flux to the pad array, then the screen is removed. A second screen with larger holes is placed over the part and pre-formed balls are gravity loaded through the stencil with any excess balls shaken off. The second screen is removed and part is reflowed upside down in an oven. This is a very time consuming process and requires considerable skill.

Thus, there is a continuing need for improved methods and apparatus for installing balls on such components, which is more reliable, takes less time and is more easily used by less highly skilled workers.

SUMMARY OF THE INVENTION

A method and apparatus for manufacturing and/or repairing electronic components having a pattern of electrical contact pads with solder balls mounted thereon, wherein at least some of the balls are missing. Generally, balls have been detached when a component must be removed from a printed circuit board during rework of the board. In beginning the repair operation, any remaining solder balls and any excess solder is removed from the contact pads by any conventional technique, such as heating the solder and wicking or wiping excess molten solder away.

Basically, the apparatus comprises a base plate, a sheet stencil formed from a material, such as stainless steel, that is not wetted by molten solder, the stencil having a plurality of holes through the sheet in a pattern corresponding to the pattern of balls on the component to be manufactured or repaired.

The stencil is mounted on the plate by means such as bolts so as to space the stencil from the plate, preferably precisely parallel to the plate. The bolts or other means are typically fastened to corners of the stencil and allow the corners to be moved toward and away from the plate, such as by threading bolts into and out of the baseplate, to adjust distance between stencil and plate and to adjust the plane of the stencil to be parallel to the plate.

Means are provided to support an electrical component with the component contact pads aligned with the stencil holes. Generally a spacer of appropriate thickness will be used between the baseplate and the component to bring the component into tight contact with the stencil. If the component has a thickness such that a spacer is not required, the central portion of the baseplate under the stencil will be the support.

The holes in the stencil are then filled with a paste containing flux and solder particles. While any filling method may be used, wiping the paste across the stencil surface with a flexible squeegee blade is preferred for simplicity and effectiveness. The holes are filled level with the openings and the surface of the stencil is wiped clean. The volume of each hole is selected in accordance with the solder content of the paste to produce solder balls having a predetermined diameter, as detailed below.

The assembly is then heated by any suitable means such as a conventional oven, hot air, etc. to melt the solder particles which then coalesce into generally spherical particles. Generally, hot air is preferred since it is particularly convenient for first drying the flux at a low heat level to avoid boiling during the high heat solder melting step. In many cases, a single high air heat level can be used to first dry the flux and immediately begin the solder melting. Once the solder is melted, the assembly is cooled, generally by simply removing the heat source and allowing the assembly to cool to room temperature. The resulting solder balls are bonded to the contact pads.

We have found that typical stainless steel sheets that have been chemically etched with the holes will bow in one direction when heated, irrespective of which side is directly heated. We have found this characteristic to be extremely useful in the apparatus of this invention. A component is placed with the contact pads against the stencil with the side down that will become convex on heating. When heat is applied during the solder melting step, the sheet will attempt to bow, forcing the stencil very tightly against the component, sealing against any solder migration along the component surface between the contact pads. Other materials having this preferential bowing in one direction, such as bimetallic sheets, graphite, some ceramics, etc, may be used if desired, although stainless steel is preferred for an optimum combination of bowing and resistance to wetting by molten solder. Fiberglass reinforced epoxy sheets in an asymmetric stack will often be effective.

This method may be automated by forming the stencil sheets in seriatim into a continuous belt and moving the components along with the moving belt through a series of operating stations.

Any conventional method may be used for aligning components with the belt, such as pins on the components or on trays for the components which enter into corresponding holes in the stencil belt as the belt approaches the line of components.

The component will typically move through stations where excess solder is removed from contact pads, the alignment of stencil holes and contact pads is accomplished, flux is applied by a wiper blade, a drying station where hot air or an oven drys the flux, a solder melting station where hot air (or other means such as an oven) melts the solder and forms the balls on each contact pad, a cooling station to solidify the balls, a cleaning station where residual flux is removed, typically with a solvent spray bath, and finally a separation station where the stencil belt is moved away from the components. The completed components may then be inspected, packaged, etc. During movement of the stencil belt from the separation station back to the first, alignment, station, the stencils may be cleaned, dried, inspected, any holes that may have collected solder may be punched out, etc.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 1:
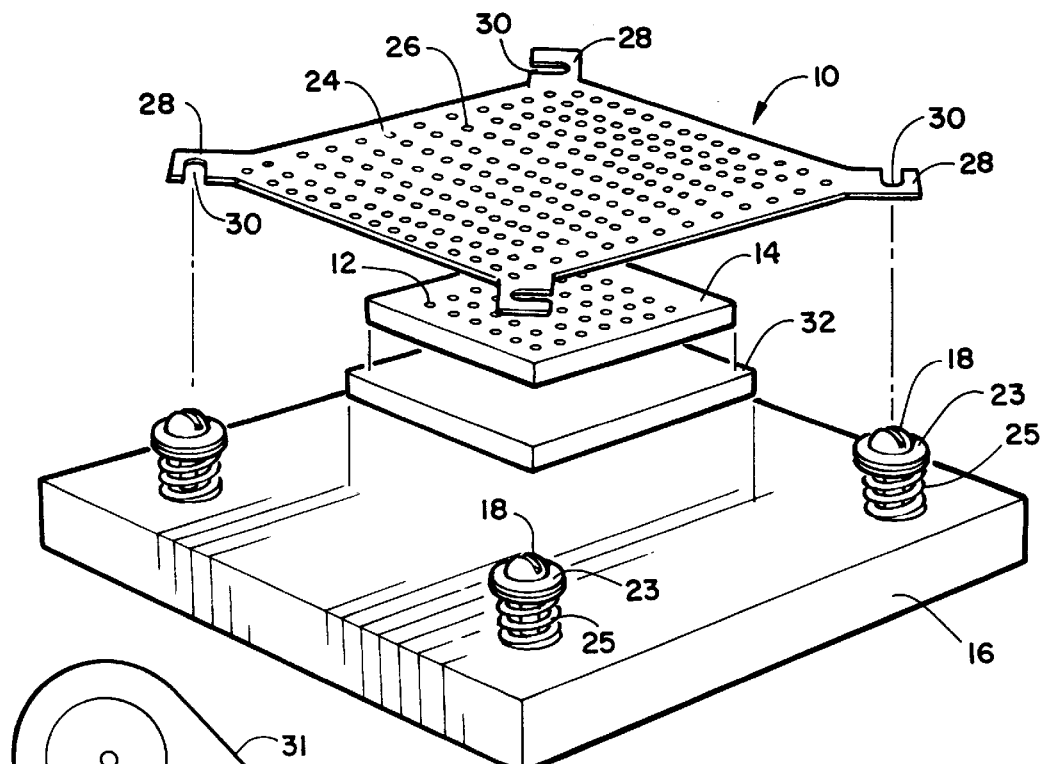
FIG. 1 is an exploded perspective view of the stencil and electronic component assembly.
Figure 2:
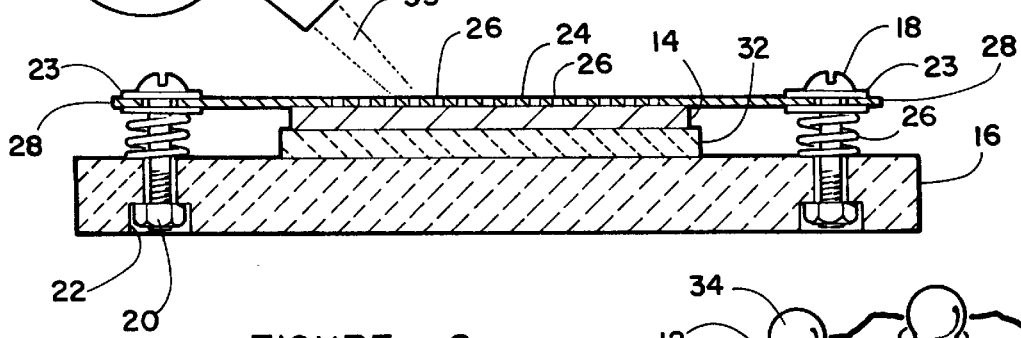
FIG. 2 is a side elevation view of the assembly.

Referring now to FIGS. 1 and 2, there is seen an assembly 10 for forming solder balls on electrical contact pads 12 of electronic component 14 to form a ball grid array.

A baseplate 16 supports assembly 10. While baseplate 16 can be formed from any suitable material, a material having low thermal conductivity, such as a ceramic or a natural stone material, such as granite, is preferred to make the assembly easier to handle immediately after the heating step, described is below. Baseplate 16 has a planar upper surface.

A plurality of flat head bolts 18 are threaded into baseplate 16, generally into threaded inserts 20 secured in holes 22 through the baseplate. Where baseplate 16 is formed from a material, such as a metal, that can be directly threaded, bolts 18 may be threaded directly into correspondingly threaded holes in the baseplate. While any suitable number of bolts 18 may be used, with most components 14 four bolts would be preferred, spaced just outside the corners of the typically square or rectangular component. While such bolts are preferred, any other suitable adjustable corner mounts may be used if desired.

One or two washers 23 are provided on each bolt 18, with a compression spring 25 between the washers to press the washer adjacent to the bolt head resiliently against the head underside. In some cases one or both washers could be eliminated and spring 25 could simply bear against the surface of baseplate 16 and the underside of the head of bolt 18.

A stencil 24 having a pattern of holes 26 corresponding to the pattern of pads 12 on component 14. While many components 14 have a very great number of very closely spaced pads 12, for clarity of illustration, the Figures show a pattern with relatively few pads.

I have found that for best results, the pattern of holes 26 in stencil 24 should continue to the edge of the stencil. Having an unperforated margin around the edge of stencil 24 may result in "oil canning"; that is, a tendency for the center of the stencil to "pop" upward into a domed shape when heated primarily at the center of the stencil. This can fling molten solder from the stencil surface and make uniform balling impossible.

Outwardly extending tabs 28 are formed as part of the stencil sheet at each corner of the stencil. A notch 30 is provided on the same rotational side of each tab 28, sized to fit around a bolt 18 between the bolt head washer 23 (or between bolt head and spring if no washer is used). To install stencil 24 on bolts 18, notches 30 are positioned on the upper edge surfaces of the upper washer 23 adjacent to the bolts and the stencil is lightly pressed downwardly and is rotated so that the notches enter between bolt head and washer. Generally, a stack of stencil 24, component 14 and any spacer 32 necessary so that the stack will fit precisely between the stencil and baseplate 16 is held together and rotated together to engage bolts 18 and notches 30. Alignment of pads 12 on component 14 and holes 22 in stencil 24 is assured by visually moving the part into position with a probe or the like.

Once the assembly 10 is complete, holes 26 are filled with a mixture of flux and solder particles and the assembly is heated, such as by a hot air source 31, to melt the solder and form solder balls on each of pads 12. Any suitable flux paste containing solder may be used. Typical of such pastes are Kaiser RMA 760. Any suitable solder may be used, typically, a low temperature solder composition may be 62% Pb/36% Sn/2% Ag and a typical high temperature solder may be a 10% Pb, 90% Sn mixture.

Figure 4:
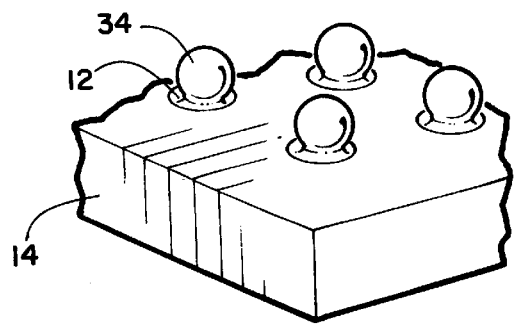
FIG. 4 is a detail perspective view of a portion of a balled electronic component.
Figure 3:
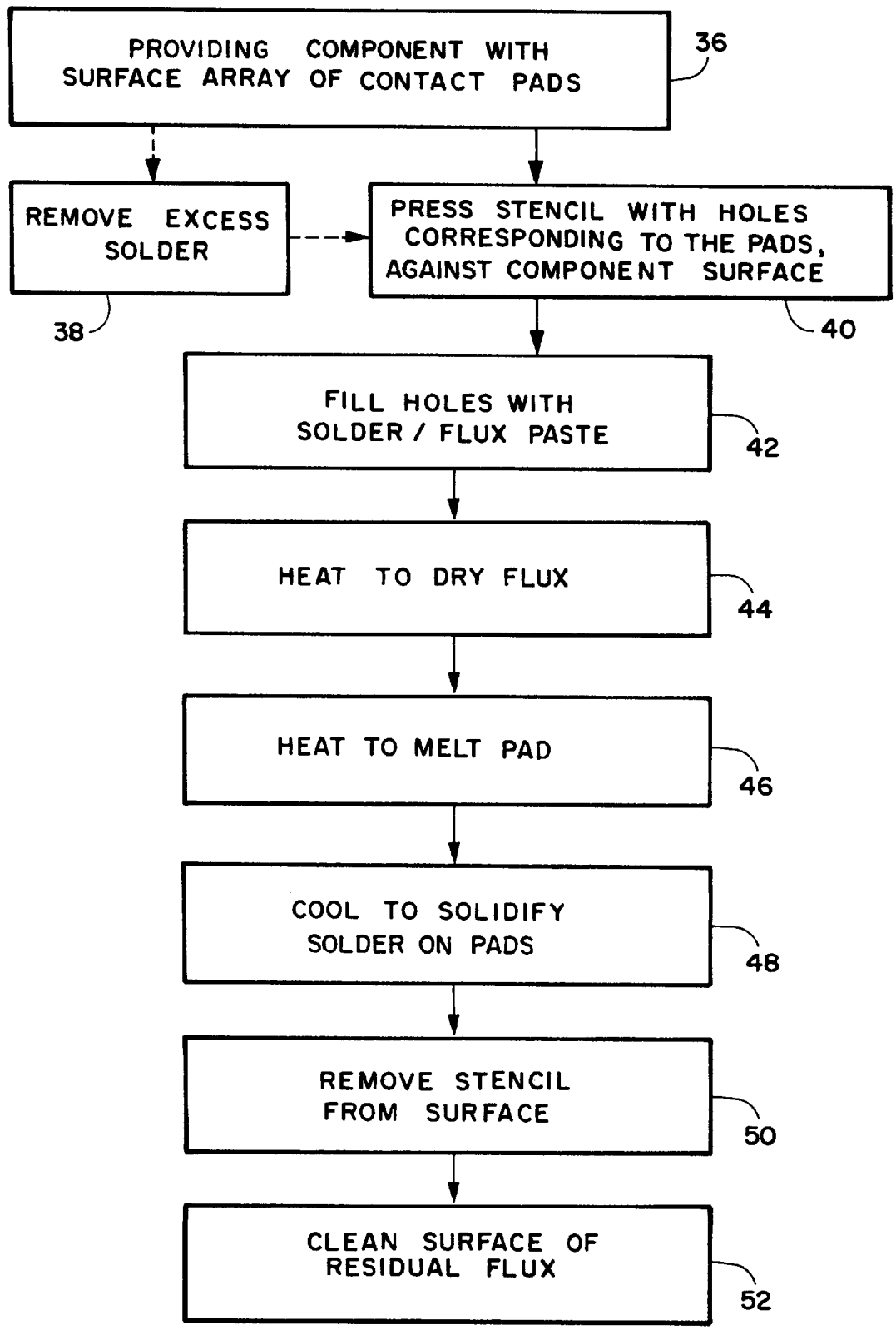
FIG. 3 is a flow diagram of the method of this invention.

The steps in forming solder balls bonded to each pad 12 within each hole 26 are illustrated in the flow diagram of FIG. 3. FIG. 4 shows a detail view of a portion of a component 14 after solder balls 34 have been formed on contact pads 12 of an electronic component 14.

A component 14 for rework installation of solder balls on contact pads 12 is provided as indicated in Block 36. Such a component has been removed from a printed circuit board by heating sufficiently to melt the solder attachments. The prior solder balls generally remain on the board when the component has been removed. If some balls or excess solder remain on component 14 removal is necessary as indicated in Block 38. Typically, about half the solder is left on the printed circuit board and about half goes with the component, forming icicle-like drops. Removal can easily be accomplished by heating the component and removing the solder by wicking or forming a "mini-wave" with a soldering iron, etc.

The component 14 is then brought into pressure contact with a stencil 24 having an array of holes 26 corresponding to the component pads, as indicated in block 40. Holes 26 are then filled with a paste of flux and solder particles, as indicated in block 42. While any suitable method may be used for filling the holes, wiping the paste across the stencil surface with a flexible blade is preferred. The hole size is selected in conjunction with the paste composition to produce solder balls having the desired diameter. Changing hole volume and/or changing the amount of solder in the flux will correspondingly change the size of the solder balls produced.

With most flux compositions, it is preferred that the flux be dried, block 44, at relatively low heat levels, preferably at about 250 to 300° F. for from about 1 to 2 minutes. This will remove volatiles that could cause the flux to boil during the solder melting step causing flux and solder to be deposited on the stencil surface. The heating can be accomplished in any suitable manner, such as hot air, an oven, etc.

The solder particles are then heated as shown in block 46 to the solder melting temperature. Typically, the preferred solders will melt at from about 350 to 425° F. Surface tension forces cause the molten solder particles to agglomerate into generally spherical balls, bonded to contact pads 12 of the electronic component. Stencil 24 is formed from a material, such as stainless steel, graphite, suitable ceramic materials, etc. Stainless steel is preferred since it resist wetting by molten solder, is easily chemically milled to form the hole pattern and tends to bow in one direction when heated. Stencil 24 is placed with the convex bowing side in contact with the component, so that the stencil is pressed against the component with increased pressure, sealing the stencil and component surface so that no solder will flow between them, creating an "air tight gasket" effect.

Assembly 10 is then cooled, as indicated in block 48, to below the solidification temperature of the solder. The stencil is then removed by rotating the stencil and component to disengage the corner notches 30 and lifting the stencil away from the now complete ball grid array on the component as shown in block 50. Component 12 now has a complete array of uniform solder balls 36 on the contact pad array, as seen in FIG. 4.

Finally, any residual flux is cleaned from component 14, block 52, and the component is ready for mounting on a printed circuit board or the like.

Figure 5:
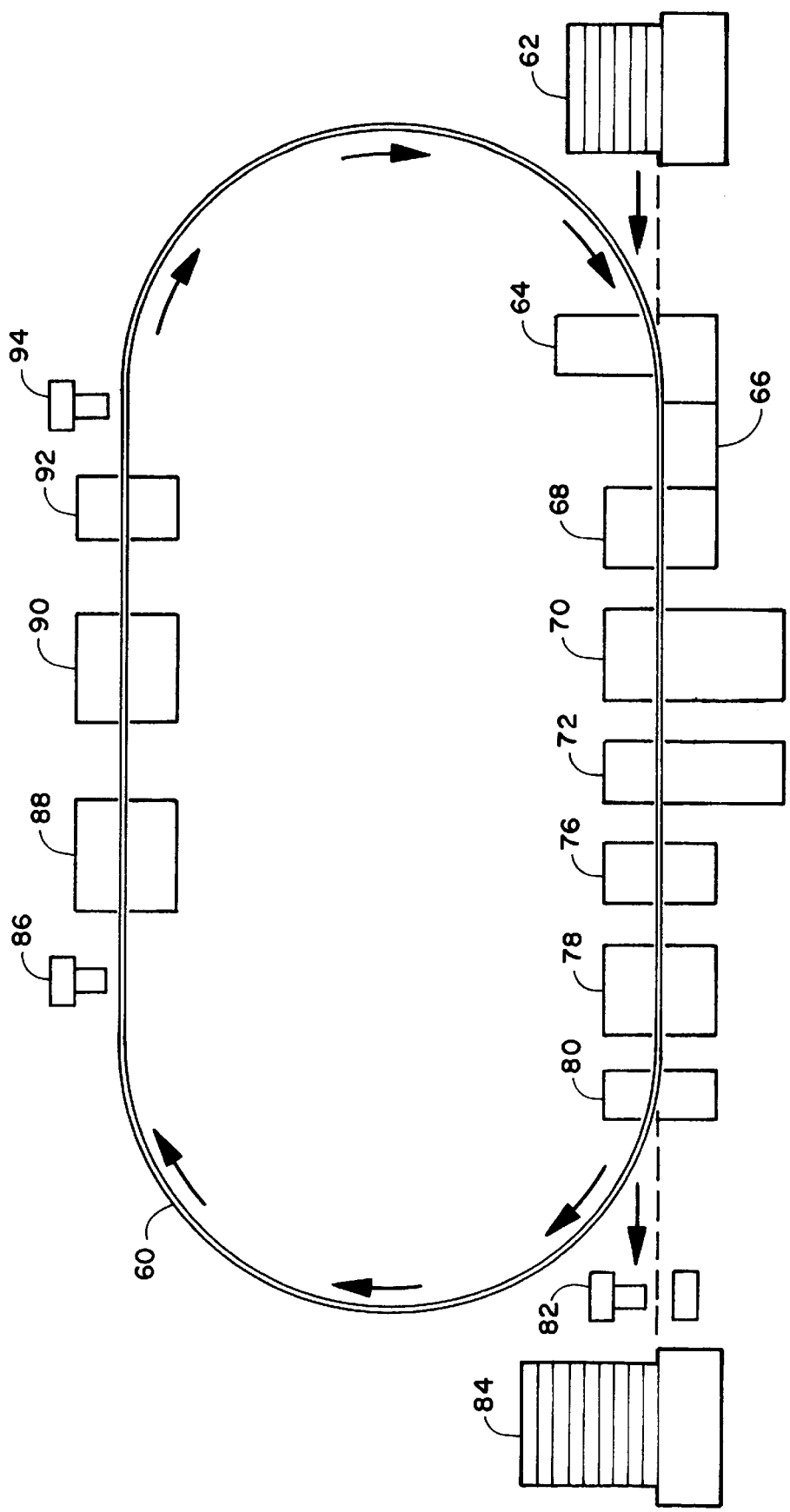
FIG. 5 is a schematic diagram of an automated, continuous, apparatus for performing the method.

While the assembly 10 as described above can be used in the method illustrated in FIG. 4 to individually secure solder balls to pads on electronic components as needed, if desired, the method can be automated using the apparatus shown in FIG. 5 to originally ball the part.

A continuous belt 60 is guided around an oval path by conventional guides and pulleys, not shown. Belt 60 includes a plurality of stencils 24 of the sort described above in seriatim.

Electronic components 14 of the sort describe above enter from incoming storage station 62. Next, the components are brought into alignment with the corresponding pattern of holes on belt 60. Alignment may be performed in any conventional manner, such as by mounting each component in a correspondingly sized pallet, aligning the component or pallet by interaction of a pin or the like on the component or pallet with a corresponding hole in an edge of belt 60, etc.

The sandwich of stencil and component are moved through a paste application station 68 where a paste of flux and solder particles is wiped across the stencil surface to fill the stencil holes. The flux is dried at station 70 by a hot air stream at a moderate temperature to evaporate volatiles from the flux and preheat the assembly. In some cases station 70 can be eliminated and the flux dried as the solder is melted at the next station.

At the solder melting station 72 a hot air stream heats the stencil to a temperature above the melting temperature of the solder, which then agglomerates forming a generally spherical solder ball by means of surface tension forces.

The stencil is cooled at station 76 to a temperature below the solidification temperature of the solder, forming spherical solder balls bonded to the contact pads.

At station 78 the stencil is separated from the component, which now bears the ball grid array. Any residual flux is cleaned from the component at station 78, such as by a solvent spray, then the component is dried at station 80, such as by a warm air stream and the component is moved past an inspection station 82 to a storage area 84.

Belt 60 continues around the oval path to the original station 64 and this sequence repeats.

Before station 64, the belt is inspected at station 86, then is brush cleaned of any residual flux or the like at cleaning station 88. If any solder or the like remains in any of the stencil holes, the holes may be punched out, the belt cleaned with a solvent or otherwise repaired at station 90. The belt is dried at station 92, given a final visual inspection at station 94 and returns to pick up another component at station 66.

While certain specific relationships, materials and other parameters have been detailed in the above description of preferred embodiments, those can be varied, where suitable, with similar results. Other applications, variations and ramifications of the present invention will occur to those skilled in the art upon reading the present disclosure. Those are intended to be included within the scope of this invention as defined in the appended claims.

I claim:

1. A kit for securing solder balls to pads on electrical components having a predetermined pattern of said electrical contact pads across a surface where each pad is intended to have a solder ball bonded thereto, which comprises:

a baseplate having a substantially flat surface;

a stencil having a pattern of holes corresponding to said predetermined pattern of pads;

said stencil formed from a material that is not wet by molten solder;

means for releasably holding said stencil a predetermined distance from said baseplate surface;

means for supporting a said electronic component between said baseplate and said stencil with said electrical contact pads in contact with, and aligned with, said stencil holes;

means for filling said stencil holes with a paste comprising flux and solder particles in predetermined proportions; and means for heating said stencil to melt said solder particles whereby said solder particles in each hole form a generally spherical molten solder ball on a corresponding electrical contact pad;

whereby removal of said heating means allows said molten solder balls to solidify into solid solder balls bonded to said electrical contact pads.

2. The kit according to claim 1 wherein said hole pattern in said stencil extends substantially to all side edges of said stencil.

3. The kit according to claim 1 further including at least one spacer having opposite parallel faces for insertion between said electronic component and said baseplate for positioning said electronic component surface at a predetermined height relative to said baseplate.

4. The kit according to claim 1 wherein said stencil is formed from a material that bows in one direction when heated to provide opposite concave and convex surfaces and said stencil is mounted with the convex surface oriented toward said baseplate, whereby as said stencil is heated pressure of said stencil against an electrical component between said stencil and said baseplate is increased.

5. Apparatus for forming solder balls bonded to a predetermined pattern of electrical contact pads on an electronic component surface, which comprises:

a base plate;

a plurality of headed bolts threaded into a surface of said plate;

a compression spring surrounding each bolt between said head and said surface;

a stencil having a pattern of holes corresponding to said predetermined pattern of electrical contact pads;

edge notches in said stencil for insertion between said bolt heads and said spring for releasably retaining said stencil; and said bolts threadable into and out of said baseplate to uniformly press said stencil against a said electronic component between said baseplate and said stencil.

6. The apparatus according to claim 5 further including at least one spacer having opposite parallel faces for insertion between said electronic component and said baseplate for positioning said electronic component surface at a predetermined height relative to said baseplate.

7. The apparatus according to claim 5 wherein said stencil is formed from a material that bows in one direction when heated to provide opposite concave and convex surfaces and said stencil is mounted with the convex surface oriented toward said baseplate, whereby as said stencil is heated pressure of said stencil against an electrical component between said stencil and said baseplate is increased.

8. The apparatus according to claim 5 further including a washer between said head and said spring so that said stencil notches can be inserted between said head and said washer.

9. The apparatus according to claim 5 wherein said hole pattern in said stencil extends substantially to all side edges of said stencil.

10. Apparatus for forming solder balls bonded to a predetermined pattern of electrical contact pads on an electronic component surface, which comprises:

a base plate;

a stencil having a pattern of holes corresponding to said predetermined pattern of electrical contact pads;

means for mounting said stencil on said base plate, spaced from a surface of said base plate;

said mounting means including means for adjusting the distance of said stencil from said plate and the angle of said stencil to said plate;

means for positioning a said electrical component between said baseplate and said stencil with said electrical contact pad pattern aligned with said stencil hole pattern;

means for filling said stencil holes with a predetermined quantity of a mixture of flux and solder particles; and means for heating at least said stencil for a period sufficient to melt said solder particles so that said solder particles coalesce into generally spherical solder balls on each electrical contact pad.

11. The apparatus according to claim 10 further including at least one spacer having opposite parallel faces for insertion between said electronic component and said baseplate for positioning said electronic component surface at a predetermined height relative to said baseplate.

12. The apparatus according to claim 10 wherein said stencil is formed from a material that bows in one direction when heated to provide opposite concave and convex surfaces and said stencil is mounted with the convex surface oriented toward said baseplate, whereby as said stencil is heated pressure of said stencil against an electrical component between said stencil and said baseplate is increased.

13. The apparatus according to claim 10 wherein said pattern of holes extends substantially to all side edges of said stencil.

14. The apparatus according to claim 10 wherein said baseplate is formed from a material having low heat conductivity.

15. A method of bonding a solder ball to each of a plurality of pads arranged in a predetermined pattern on an electronic component, less than all of which pads having a solder ball bonded thereto, which comprises the steps of:

removing any solder balls and excess solder from said contact pads;

pressing a stencil against said surface, said stencil formed from a material that is non-wettable by molten solder, said stencil having a pattern of holes therethrough corresponding to a said electrical contact pattern;

substantially filling said holes with a paste comprising flux and solder;

heating said stencil and paste to the melting temperature of said flux and solder to form generally spherical solder balls;

cooling said surface to solidify said solder balls and bond said solder balls to said electrical contacts; and removing said stencil from said surface.

16. The method according to claim 15 further including the step of applying heated air to said stencil to dry said paste prior to heating said stencil.

17. The method according to claim 15 including wherein said heating of said stencil is accomplished by applying heated air thereto.

18. The method according to claim 15 wherein said stencil is formed from stainless steel sheet that bows outwardly in one direction when heated and wherein the outwardly bowing side is pressed against said surface so that said stencil is uniformly and tightly pressed against said surface when heated.

19. The method according to claim 15 wherein said holes are filled with said paste by wiping said paste over the surface of said stencil until said holes are filled and said surface is substantially free of paste.

20. The method according to claim 15 wherein said solder is selected from the group consisting of a mixture of about 63 wt % tin and about 37 wt % lead, a mixture of about 62 wt % tin, about 36 wt % lead and about 2 wt % silver and a mixture of about 10 wt % tin and about 90 wt % lead.

* * * * *